United States Patent [19]

Smith

[11] Patent Number: 4,720,699

[45] Date of Patent: Jan. 19, 1988

[54] OPTICAL ENCODER USING LINE ARRAY DETECTORS

[76] Inventor: Ronald H. Smith, 6700 Connecticut Ave., Chevy Chase, Md. 20815

[21] Appl. No.: 792,115

[22] Filed: Oct. 28, 1985

[51] Int. Cl.⁴ .............................................. H03M 1/22
[52] U.S. Cl. ........................... 340/347 P; 250/231 SE; 340/347 M; 33/1 D; 33/505
[58] Field of Search ........................ 340/347 P, 347 M; 250/231 SE, 237 G; 33/1 D, 505

[56] References Cited

U.S. PATENT DOCUMENTS 4,074,258  2/1978  Dore et al. ...................... 340/347 P
4,465,373  8/1984  Tamaki et al. ............. 250/237 G X
4,631,519  12/1986  Johnston ......................... 340/347 P

*Primary Examiner*—T. J. Sloyan

[57] ABSTRACT

Absolute optical encoder device using a line array detector in conjunction with a single strip of encoding bars. The bars are orthogonal to the detector array line and may be long enough to allow motion parallel to the bars without loss of measurement continuity. High resolution is achieved by combining use of a small difference between the detector element spacing and the bar spacing in selected regions to produce a vernier effect, enabling measurement to the precision of a fraction of a detector element. High resolution is further achieved by traverse of a vernier regin edge across a multiplicity of detector elements upon which adjacent vernier regions are optically superimposed, and by identification of each vernier region as a unique member of a numbered series using distinguishable patterns in the space between vernier regions or in the structure of the vernier regions themselves.

6 Claims, 5 Drawing Figures

OPTICAL ENCODER USING LINE ARRAY DETECTORS

BACKGROUND OF THE INVENTION

This invention pertains generally to absolute optical encoders and more particularly to an absolute optical encoder using a line array of detector elements.

In the past, absolute optical encoders have been devised typically by providing several strips of alternating dark and light bands; each band with a detector and each band having a resolution differing in count density typically by a factor of two relative to the adjacent strips. The coarsest strip is a dark zone covering half the measurement field and a light zone covering the other half. The highest density strip has enough alternating bands to provide the resolution required for a particular encoder function. Generally, the on-off sequence of detectors can be interpreted as a binary number defining the encoder position. The number of discernable positions on the encoder is $2^n$, where n is the number of strips of alternating bands. A refinement on the known art involves the use of pairs of transparent and opaque bars optically superimposed on the encoder pattern which are staggered relative to one another in the position at which the maximum transmission occurs by ¼ of the spacing between adjacent dark bar centers. Such a refinement yields the ability to measure position to a fraction of the bar center spacing. Known optical encoders are generally used either for measuring position along a line of motion or angle of rotation around a fixed center. In the linear position mode, the known encoders must be constrained to limit orthogonal to strip motion to less than the distance separating adjacent strips of alternating dark and light encoder bands.

In the known designs for absolute optical encoders, relative motion between encoder bands and detectors is sensed by a variety of means. One means is to use transparent and opaque bands with collimated light passing through to detectors or slit apertures in close proximity to the encoder bars. A second approach involves imaging the encoder bars onto detectors or slit apertures. Each of the known encoder designs provides a means of superimposing a shadow or image of the encoder bars on the detector elements or on apertures passing light to the detector elements.

SUMMARY AND OBJECTS OF THE INVENTION

The invention provides an absolute optical encoder using a line array detector in conjunction with an encoder pattern which permits high resolution. The invention encompasses any of the known means of superimposing the encoder bars on detector elements or on apertures passing light to the detector elements.

It is in general an object of the invention to provide an improved absolute optical encoder.

Another object of the invention is to use a single strip of light and dark bars to provide the same or better resolution as a known absolute encoder with several strips.

Another object of the invention is the provision of regularly spaced regions on the encoder strip, close enough together that at least two such regions are always superimposed on the detector array, in which a small difference exists between the detector element spacing and the light and dark bar spacing such that relative motion of less than one detector element spacing can be derived from the detector readings.

Another object of the invention is to further increase the number of separately identifiable resolution elements by providing a means of identifying which one of the several detector elements is optically superimposed on the edge of a given vernier segment.

Another object of the invention is to increase yet further the number of separately identifiable resolution elements by providing an identifying pattern associated with each vernier segment which identifies it as a particular member of a numerical sequence. The identifying pattern may lie in the space between vernier segments or it may be imbedded in the structure of the vernier segments.

Another object of the invention is to provide an optical encoder of the above character in which light and dark bars are orthogonal to the direction of motion and extend far enough to allow a range of motion parallel to the bars without loss of measurement continuity.

Another object of the invention is to provide, in conjunction with other elements, a computer or other electronic processor which accepts detector outputs and produces a numerical indication of encoder position.

Additional objects and features of the invention will be apparent from the following description in which the preferred embodiments are set forth in detail in conjunction with the accompanying drawings.

DESCRIPTION OF THE PREFERRED EMBODIMENTS

Figure 1:
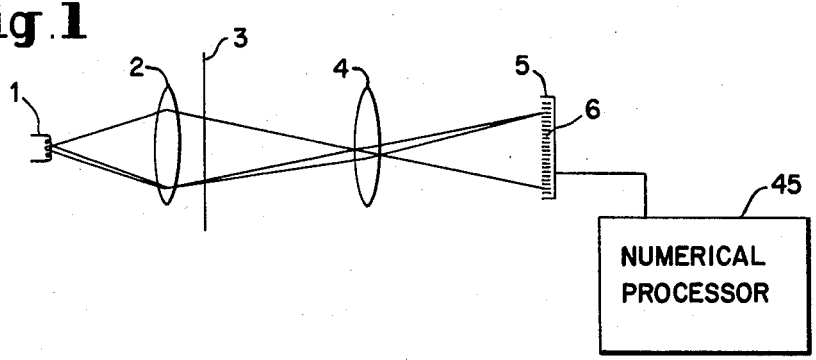
FIG. 1 is a schematic illustration of an optical encoder device according to the invention.

As illustrated in FIG. 1, the preferred embodiment of the device includes a radiant energy source 1 from which radiant energy, hereinafter characterized as light, proceeds through a lens 2. The lens 2 directs light from source 1 through an encoder pattern transparency 3 in which alternating transmissive and non-transmissive bars are disposed orthogonal to the plane of FIG. 1, and in a plane segment intersecting FIG. 1 along the line indicating encoder pattern transparency 3. Transparency 3 defines an optical object, and lens 4 forms an image of the encoder pattern at linear detector array 5. The detector elements 6 of array 5 lie in the plane of FIG. 1 and are oriented to receive light from lens 4.

In an alternative configuration, a lens and detector arrangement similar to lens 4 and array 5 would image light reflected from a surface. In such a case, the encoder pattern bars would be comprised of reflective and non reflective surfaces. Also, bars forming an optical object may be designed to reflect or transmit any intermediate light level between the maximum and minimum levels defined by available light and absorber properties.

An electronic processing means 45 derives a numerical position value from the signals generated in detector array 5.

Figure 2:
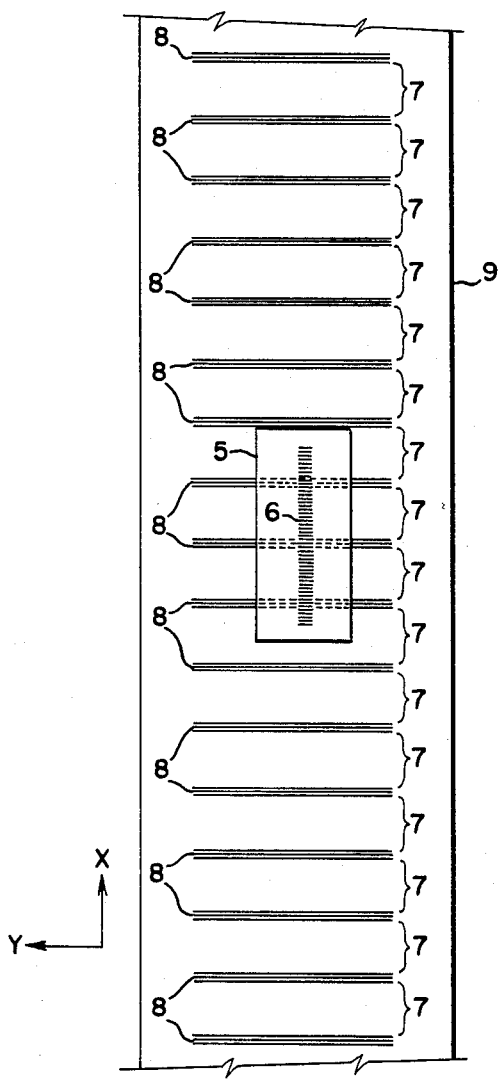
FIG. 2 is a schematic illustration of the encoder strip and line array detector configuration of the encoder device of FIG. 1.

Operation of the encoder device of FIG. 1 can be described with reference to FIG. 2. A line array detector 5 is exposed to a portion of the image 9 of encoder pattern transparency 3. Detector elements 6 are disposed in a line spanning two or three vernier segment images 8 and one or two identification pattern segment images 7 on the encoder pattern image 9. The arrangement of detector elements 6 in relation to encoder image 9 is such that over the full range of measurement in the x direction shown in FIG. 2, at least one identification pattern segment image 7 and its two adjacent vernier segment images 8 are located within the span of detector elements 6 along the x coordinate. Further, the arrangement illustrated in FIG. 2 is such that relative translational motion in the y direction between encoder image 9 and line array detector 5 is permissible within a certain range without loss of position measurement function. The permissible y direction motion occurs because image 9 of encoder pattern 3 is comprised of bars oriented parallel to the y axis. The permissible range of motion parallel to the y axis is defined by the length of bars comprising the encoder pattern image.

Figure 3:
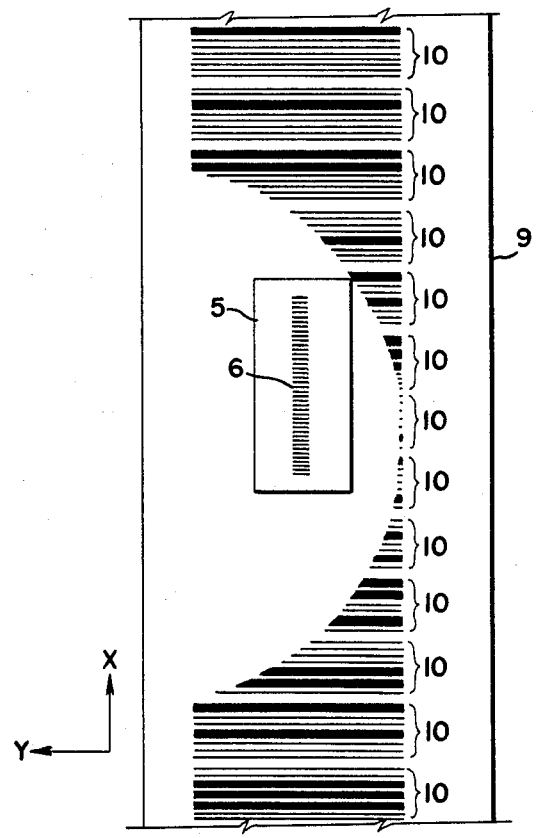
FIG. 3 is a schematic illustration of the encoder strip and line array detector in a preferred embodiment where the pattern identifying each vernier strip as a distinct element in a numerical sequence is embodied in the structure of the vernier segment itself.

In a preferred embodiment, operation of the encoder device can be described with reference to FIG. 3. A line array detector 5 is exposed to a portion of the image 9 of encoder pattern transparency 3. Detector elements 6 are disposed in a line spanning a distance equal to the width of two combined vernier/identification pattern segments 10. The arrangement of detector elements 6 in relation to encoder image 9 is such that over the full range of measurement in the x direction shown in FIG. 3, at least one vernier/identification pattern segment 10 is located within the span along the x coordinate of detector elements 6. In a similar manner to that shown in FIG. 2, the arrangement illustrated in FIG. 3 is such that relative translational motion in the y direction between encoder image 9 and line array detector 5 is permissible within a certain range without loss of position measurement function.

Operation of the encoder device in a preferred embodiment described with reference to FIG. 3 can be further described with reference to FIG. 4. Detector elements 6 are uniformly spaced with interval 33 and disposed in a straight line beginning with first detector element 27 and ending with (for example) 32nd detector element 28. Boundaries 13 through 26 delineate transitions between dark and light zones of a bar pattern image in which the bars are perpendicular to the line along which detector elements 6 are disposed. Boundaries such as boundary 14 in which there is a light zone below (decreasing x value) the boundary and a dark zone above (increasing x value) correspond to digital ones, provided they are located at one of the four significant boundaries 32 which lie on evenly spaced x values occuring in each of the vernier/identification pattern segment images 10. Boundaries such as boundary 15 in which there is a dark zone below the boundary and a light zone above the boundary correspond to digital zeroes, provided they are located at a significant boundary 32. Adjacent significant boundaries 32 within a given vernier/identification pattern segment image 10 are spaced apart from one another by 31/8 detector element intervals 33. Non significant boundaries such as boundaries 17 and 19 lie between adjacent significant boundaries 32 in cases where the digital values corresponding to the light/dark transitions are not changing. The purpose of the non significant boundary is to return to a light or dark zone, whichever was below the preceding significant boundary so that a given transition can correspond to the same digital value as the preceding transition. For example, the light to dark transition at boundary 16 corresponds to a digital one. The dark to light transition at boundary 17 has the purpose of permitting a digital one corresponding to a light to dark transition at boundary 18.

The transition between one vernier/identification pattern segment 10 and the next such segment is distinguished by the addition of one detection interval 33 to the space separating adjacent significant boundaries 32. Separation of adjacent significant boundaries by $1+(31/8)$ as opposed to 31/8 detector intervals 33 denotes shifting from one to the next segment image 10. Shifting from one segment image 10 to the next occurs in FIG. 4 at zones 29, 30 and 31. Within a given segment image 10, the distance between adjacent boundaries is always either one or two times the minimum separation distance 36 between boundaries. In the example of FIG. 4, the minimum separation distance 36 between boundaries is numerically equal to 31/16 detector intervals 33.

Operation of the encoder device in a preferred embodiment described with reference to FIG. 3 can be further described with reference to FIG. 5. In a graphical display, the ordinate 34, labeled "s" represents the normalized output of detector elements 6 in a numbered sequence. A dual abscissa scale is shown for FIG. 5 in which the correspondence is illustrated between detector number given on ordinate 46 and the linear numerical scale 35 labeled "x". On the x scale, an integer difference of 1 represents a shift of exactly one detector element spacing 33 along the x axis of FIG. 4 except for the omitted detector elements where an integer difference of 1 in x represents a shift of exactly two detector element spacings. The omissions of detector elements numbered 1, 16 and 32 are for the purpose of making all x intervals between boundaries equal to some integer times the smallest interval 36 between boundaries. The transitions between vernier/identification pattern segments 10 are marked in the preferred embodiment described with reference to FIG. 5 by a separation between adjacent boundaries which is exactly one detector element spacing 33 greater than one or two times the smallest interval 36 between boundaries.

With reference to the specific conditions illustrated in FIGS. 3, 4 and 5, a suitable algorithm for deriving a position measurement from detector output values 37 is as follows:

Step 1; digitize all values 37, normalize to a scale of zero to one, apply any needed correction for fixed pattern noise, and store in memory.

Step 2; identify boundaries as ordinate 35 x values where the abcissa 34 s value changes from greater than an average value 42 (hereinafter "s̄") to less than s̄ (falling transition) or from less than s̄ to greater than s̄ (rising transition).

Step 3; at each transition found in step 2, select the detector value, either immediately preceding the transition or immediately following the transition, which is most nearly equal to s̄. Derive a more precise figure for the ordinate value of the transition from the formula given in equations 1 and 2 below.

If transition is rising:

$$x = (\text{Detector \#}) + \bar{s} - (\text{Detector \#}) \quad \text{Equation 1}$$

If transition is falling:

$$x = (\text{Detector \#}) + s(\text{Detector \#}) - \bar{s} \quad \text{Equation 2}$$

where (Detector #) is the detector number 46 whose s value was found most nearly equal to $\bar{s}$ and s(Detector #) is the s value of said detector. Those versed in the art will understand that equations 1 and 2 are accurate only for idealized detector spatial response and perfect imaging, and that a more accurate form of equations 1 and 2 can be derived from measurements of the detector response at actual transitions. The x value of equation 1 or 2 will exactly equal an integer in the case where a transition is exactly centered on a detector element.

Step 4; Identify those pairs of transitions whose x value differences are more nearly equal to $1+31/8$ than $31/8$ or more nearly equal to $1+31/16$ than $31/16$. The first (lower x value ) of any such pair defines, in the example of FIG. 4, the least significant bit in a 4 bit binary number. The transition whose x value is defined in equation 3 below denotes, in the example of FIG. 4, the most significant bit of a new vernier/identification pattern segment 10.

$$x(\text{Most Significant Bit}) = x(\text{Least Significant Bit}) + 1 + 31/8 \quad \text{Equation 3}$$

where x(least Significant Bit) is the lower x value of the transition pair with x value difference more nearly equal to $31/8+1$ than $31/8$ or more nearly equal to $31/16+1$ than to $31/16$. The added unity term represents the additional size of zones marking the shift from one vernier/identification pattern segment 10 to the next. The fraction 31/8 represents the fact that 31 detector element increments 33 equal 8 times the distance between adjacent significant boundaries 32 within a given vernier/identification pattern segment 10.

Step 5; determine the locations of all transitions within a given vernier/identification pattern 10 denoting bits of a binary digital number by iterative use of equation 4 below.

$$x(\text{subsequent bit}) = x(\text{adjacent more significant bit}) + 31/8 \quad \text{Equation 4}$$

Figure 4:
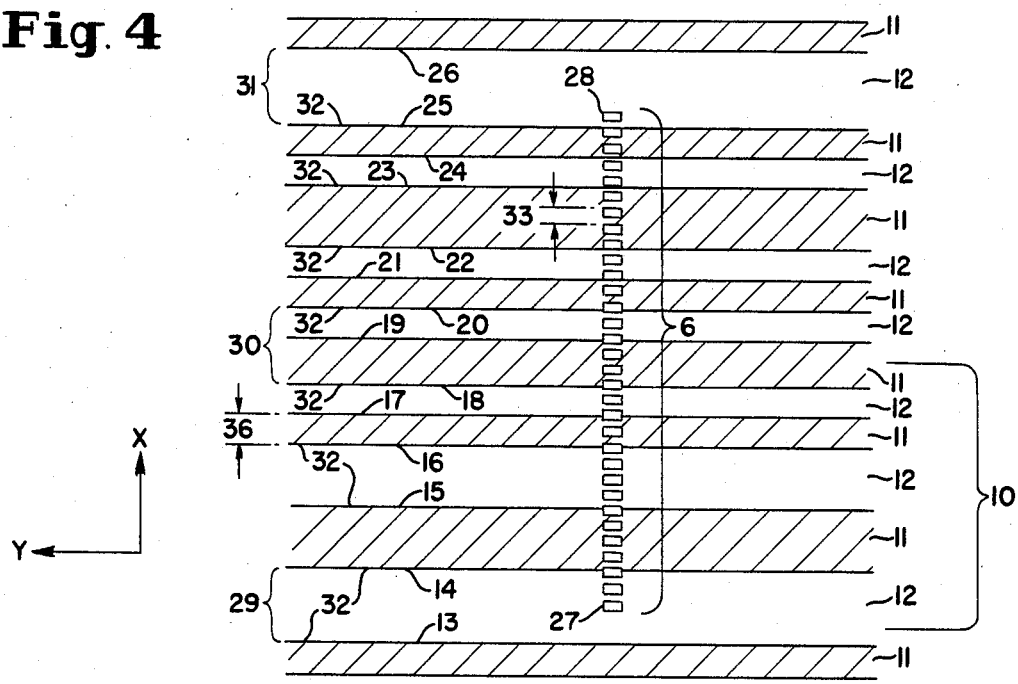
FIG. 4 is a schematic illustration showing details in a portion of the encoder strip of FIG. 3.
Figure 5:
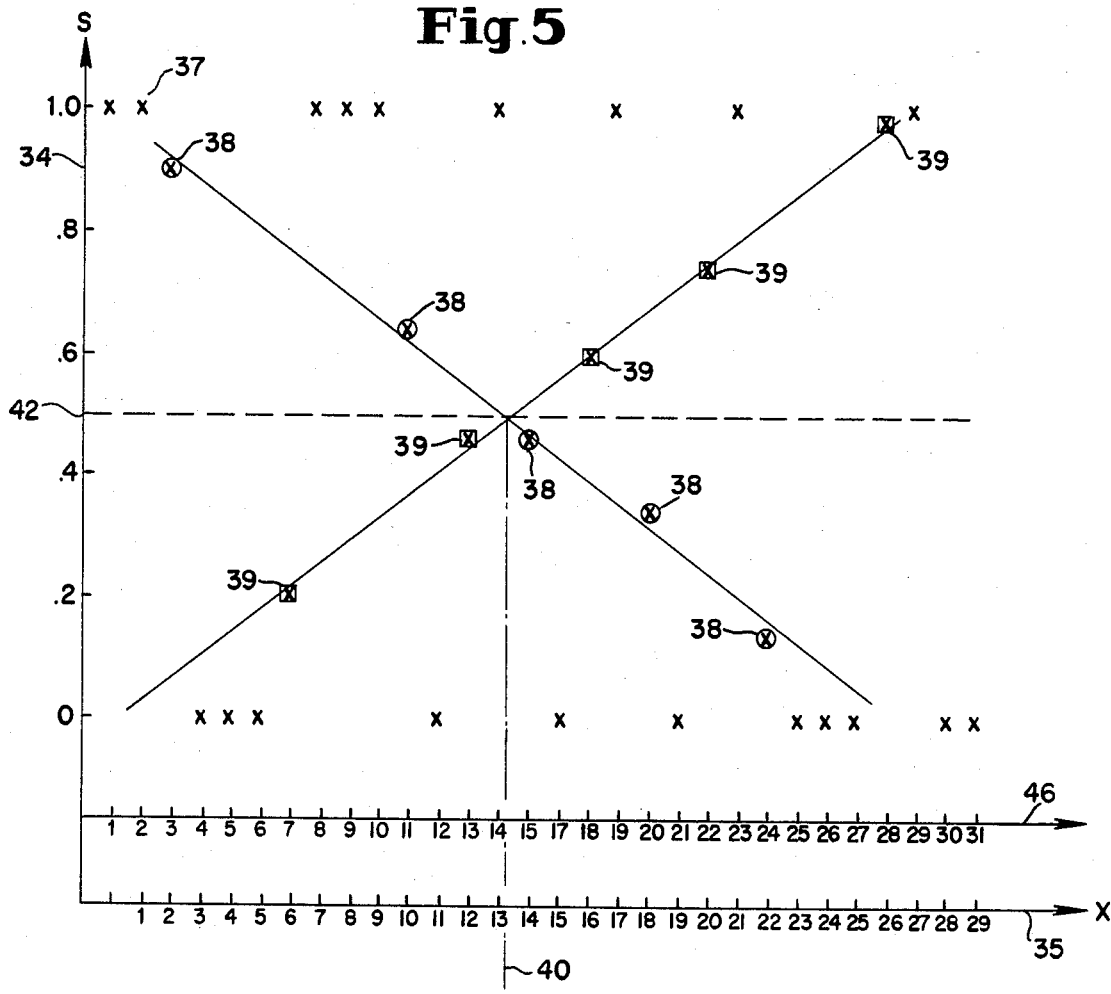
FIG. 5 is a schematic illustration showing typical detector readings from a portion of the detector strip of FIG. 3.

In equation 4, x(subsequent bit) is the x coordinate of a given transition denoting a binary digital bit, x(adjacent more significant bit) is the x coordinate of a transition denoting the immediately preceding binary digital bit, and the fraction 31/8 is the separation along the x axis between transitions denoting successive digital bits within a given vernier/ identification pattern segment 10 in the example of FIG. 4. Contine to use equation 4 until x coordinates for transitions denoting all four bits of the identification pattern are found.

Step 6; by examination of 2 or 3 detector values in the vicinity of each transition denoting a binary digitial bit, determine whether the transition is rising or falling. Rising transitions denote a binary digital 0. Falling transitions denote a binary digital 1. Record the 4 bit digital value in memory. Denote the 4 bit digital value as ID#.

Step 7; for all transitions found in step 2, separate into rising and falling transitions. For both kinds of transitions, produce a table of ordered pairs of detector value and detector number.

Step 8; find the detector value most nearly equal to $\bar{s}$. If the detector number (hereinafter MID#) of detector with most nearly $\bar{s}$ detector value is less than 10, fill in zero and negative detector number values based on the formula:

$$\text{Detector value}(\text{Detector}\#i) = \text{Detector value}(\text{Detector}\#i+32) \quad \text{Equation 5}$$

For example, the value for detector #0 will be the same as that for detector #32, the s value for detector #−1 will be the same as that for detector #31, and so on. If the detector number of the detector with most nearly $\bar{s}$ detector value is greater than 22, fill in greater than maximum detector number values based on the formula:

$$\text{Detector Value}(\text{Detector}\#i) \text{ Detector Value}(\text{Detector}\#i-32) \quad \text{Equation 6}$$

For example, the value for detector #33 will be the same as that for detector #1, and so on. At the completion of step 8, ordered pairs of detector # and value will be defined for the range of detector numbers from MID#−10 to MID#+10.

Step 9; Beginning with detector number MID#−10 and working to MID#+10, assign new x values to all transitions. For transitions below the first transition denoting a least significant bit, let x=(detector number). For detector numbers above the first transition denoting a least significant bit, let x=(detector number)−1. In general, for detector numbers above the nth transition denoting a least significant bit, let x=(detector number)−n. Continue x value assignments for all transitions within the (MID#−10) to (MID#+10) detector number range. Step 9 has the effect of making all transitions an equal distance apart along the reassigned x axis. It is only after completion of this step that ordinates 35 and 46 have the relationship shown in FIG. 5 where certain detector numbers have been deleted.

Step 10; find best fit straight lines to the rising and falling transition ordered pairs using a least squares or other appropriate curve fitting method. Compute the x value where the two best fit lines intersect. Denote intersection coordinate as XMID. Compute the vernier location of detector #1 from the formula below:

$$x = 31/2*(\text{ID}\#) - \text{Detector}\#(\text{Most significant bit}) - \text{XMID}/31 \quad \text{Equation 7}$$

Determine Detector#(Most significant bit) for equation 7 as the integer which most nearly satisfies the following equation:

$$\text{Detector}\#(\text{Most significant bit}) = x(\text{most significant bit}) + \{x(\text{most significant bit}) - \text{XMID}\}/31 \quad \text{Equation 8}$$

where x(most significatn bit) is the x value of the transition denoting the most significant bit of the segment 10 in which ID# of equation 7 occurs. In equation 7, the third term on the right side is the vernier measurement. The second term on the right side is the direct count of motion of a locatable boundary relative to the detector elements 6. The first term on the right side provides the range extension associated with identification of each vernier/identification pattern segment 10 as a unique member of a numbered series.

In the case of an angle encoder with radial bars emanating from a common center, the detector array will only be exactly orthogonal to the encoder bar image in the center of the array. Also, the spacings of encoder bars along the detector array will be slightly non-linear. In this case, the algorithm may contain non-linear terms designed to compensate for the non-linear effects or the computations may be based on a linear approximation and restriction of detector elements used in vernier calculations to those near the center of the detector array.

I claim:

1. Encoder comprised of pattern, line detector array, means of optically superimposing pattern on detector array, using said pattern of bars approximately perpendicular to said linear detector array in which a small difference between detector element spacing and bar image spacing extends over the entire detector array length so that sensing of pattern image position change which is a small fraction of one detector element is made possible, and in which each of a series of contiguous pattern segments embodies features identifying a given segment as a unique member in a numerical sequence, said encoder having electronic processing means cooperating with said pattern and array configurations for determination of a numerical position value using an algorithm characterized in that;

the spacing between adjacent detector elements is designated as a unit length bearing a predetermined relationship to the length of said pattern segments, and the signal amptitude from each detector element is converted to digital form for numerical processing, and an average value of detector element signal values is computed, and instances of signal level rising from below average to above average signal or from above to below average are identified as rising and falling transitions respectively, and an approximate formula relating signal strength to the relative locations of a transition and the center of a detector element spanning the transition is used to calculate the transition location to an accuracy of better than half a detector element spacing, and positional separation of each pair of adjacent transitions is computed, and those transitions signifying bits of an identifying address word are located and the identifying address word for a given pattern segment is determined by equating a rising transition to a digital zero and a falling transition to a digital one, and the rising transitions are treated as a separate group within which the plot of signal value versus detector number approximately fits a straight line which is found by a least squares method, and the falling transitions are treated as a separate group within which the plot of signal value versus detector number approximately fits a straight line which is found by a least squares method and which is of opposite slope to the line fitting rising transitions, and the intersection of best fit lines to rising and falling transition groups is computed, giving a vernier indication of position to an accuracy of a small fraction of a detector element wherein errors related to edge sensing are canceled, and said segment address word is combined with the detector element number of the detector element spanning the transition defining the most significant bit of the segment address word and with said vernier indication of position to provide an absolute position measurement to an accuracy of a small fraction of a detector element, said absolute measurement being derivable for any position within said series of contiguous pattern segments.

2. Encoder comprised of pattern, line detector array, means of optically superimposing pattern on detector array, using said pattern of bars approximately perpendicular to said linear detector array, in which each of a series of contiguous pattern segments embodies features identifying a given segment as a unique member in a numerical sequence, said encoder having electronic processing means cooperating with said pattern and array configurations for determination of a numerical position value using an algorithm characterized in that;

the spacing between adjacent detector elements is designated as a unit length bearing a predetermined relationship to the length of said pattern segments, and the signal amplitude from each detector element is converted to digital form for numerical processing, and an average value of detector element signal values is computed, and instances of signal level rising from below average to above average signal or from above average to below average are identified as rising and falling transitions respectively, and an aproximate formula relating signal strength to the relative locations of a transition and the center of a detector element spanning the transition is used to calculate the transition location to an accuracy of better than half a detector element spacing, and positional separation of each pair of adjacent transitions is computed, and most of said positional separations between adjacent transitions are found to measure, for example, approximately two or approximately four detector element units whereas one of said positional separations in each given pattern segment is found to measure, for example, approximately three or approximately five detector element units, thus providing a locatable reference point within each pattern segment at the expense of only one added detector element unit width to one pattern bar within each pattern segment, and locations of those transitions signifying bits of an identifying address word are found in predetermined positions relative to said locatable reference point within each pattern segment and the identifying address word for a given pattern segment is determined by equating a rising transition to a digital zero and a falling transition to a digital one, and said segment address word is combined with the detector element number of the detector element spanning the transition defining an edge of the approximately three or five unit wide pattern bar comprising the locatable reference point of the given segment to provide an absolute position measurement, said absolute measurement being derivable for any position within said series of contiguous pattern segments.

3. Encoder as described in claim 2, said encoder having electronic processing means cooperating with said pattern and array configurations for determination of a numerical position value using an algorithm chracterized in that;

the rising transitions are treated as a separate group within which the plot of signal value versus detector number approximately fits a straight line which is found by a least squares method, and the falling transitions are treated as a separate group within which the plot of signal value versus detector number approximately fits a straight line which is found by a least squares method and which is of opposite slope to the line fitting rising transitions, and the intersection of best fit lines to plots from rising and falling transition groups is computed, giving a vernier indication of position to an accuracy of a small fraction of a detector element wherein errors related to edge sensing are canceled, and said segmenet address word is combined with the detector element number of the detector element spanning the transition defining an edge of said approximately three or five unit wide pattern bar comprising the locatable reference point of the given segment and with said vernier indication of position to provide an absolute position measurement to an accuracy of a small fraction of a detector element, said absolute measurement being derivable for any position within said series of contiguous pattern segments.

4. Encoder as described in claim 3 comprised of pattern, line detector array, means of optically superimposing pattern on detector array, using said pattern of bars approximately perpendicular to said linear detector array in which a small difference between detector element spacing and bar image spacing permits measurement of a position change which is a small fraction of one detector element, and in which a locatable point in a given pattern segment is identified with one of the detector array elements and thereby given a numerical position value, and in which each of a series of contiguous pattern segments embodies features identifying a given segment as a unique member in a numerical sequence, said features identifying a given segment also embodying said small difference between detector element spacing and bar image spacing so that only one kind of pattern is needed within a given segment, said encoder having electronic means cooperating with said pattern and array configurations for determination of a numerical position value using an algorithm characterized in that said numerical sequence identification of a given pattern segment is combined with said numerical position value derived from detection element number of said locatable point in said pattern segment and with said vernier indication of position to provide an absolute position measurement to an accuracy of a small fraction of a detector element, said absolute measurement being derivable for any position within said series of contiguous pattern segments.

5. Encoder as described in claim 3 in which the indefinitely extendable length of bars in the encoder pattern allows motion of the detector array in a direction parallel to the bars without loss of measurement function, so that extent of travel in the direction parallel to the bars is not limited by any feature of the detector array.

6. Encoder as described in claim 3 which is suitable for measurement of angular motion about a center of rotation by virtue of encoder bars radially disposed about said center of rotation with detector array line approximately perpendicular to the bar intersecting array center.

* * * * *